(12) United States Patent
Ohwada et al.

(10) Patent No.: US 6,435,956 B1
(45) Date of Patent: Aug. 20, 2002

(54) WAFER HOLDER AND POLISHING DEVICE

(75) Inventors: Shin Ohwada; Teruhiko Ichimura, both of Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/647,560

(22) PCT Filed: Feb. 2, 2000

(86) PCT No.: PCT/JP00/00569

§ 371 (c)(1),
(2), (4) Date: Oct. 2, 2000

(87) PCT Pub. No.: WO00/45993

PCT Pub. Date: Aug. 10, 2000

(30) Foreign Application Priority Data

Feb. 2, 1999  (JP) .......................................... 11-025364

(51) Int. Cl.[7] .............................................. B24B 29/00
(52) U.S. Cl. ............................ 451/289; 451/5; 451/41; 451/8
(58) Field of Search ................................ 451/289, 288, 451/388, 389, 41, 5, 8

(56) References Cited

U.S. PATENT DOCUMENTS

| | | | |
|---|---|---|---|
| 5,762,539 A | | 6/1998 | Nakashiba et al. ........... 451/41 |
| 5,916,016 A | * | 6/1999 | Bothra ........................ 451/398 |
| 5,941,758 A | | 8/1999 | Mack .......................... 451/41 |
| 5,964,653 A | * | 10/1999 | Perlov et al. ................. 451/288 |
| 6,027,398 A | * | 2/2000 | Numoto et al. ............. 451/285 |
| 6,056,632 A | * | 5/2000 | Mitchel et al. .............. 451/288 |
| 6,093,089 A | * | 7/2000 | Chen et al. .................. 451/288 |
| 6,106,378 A | * | 8/2000 | Perlov et al. ................ 451/288 |
| 6,113,479 A | * | 9/2000 | Sinclair et al. ............... 451/288 |
| 6,132,298 A | * | 10/2000 | Zuniga et al. ............... 451/288 |
| 6,143,123 A | * | 11/2000 | Robinson et al. ........... 156/344 |
| 6,196,905 B1 | * | 3/2001 | Inaba .......................... 451/288 |
| 6,203,414 B1 | * | 3/2001 | Numoto et al. ............. 451/288 |
| 6,241,593 B1 | * | 6/2001 | Chen et al. .................. 451/288 |
| 6,244,942 B1 | * | 6/2001 | Zuniga ........................ 451/288 |
| 6,270,397 B1 | * | 8/2001 | Wu .............................. 451/288 |
| 6,273,804 B1 | * | 8/2001 | Numoto ...................... 451/288 |
| 6,277,009 B1 | * | 8/2001 | Chen et al. .................. 451/288 |
| 6,280,306 B1 | * | 8/2001 | Hosoki et al. ............... 451/288 |

FOREIGN PATENT DOCUMENTS

| | | |
|---|---|---|
| JP | 4-19065 | 1/1992 |
| JP | 9-76152 | 3/1997 |
| JP | 9-193010 | 7/1997 |
| JP | 9-225821 | 9/1997 |
| JP | 11-179652 | 7/1999 |
| JP | 2000-33558 | 2/2000 |

* cited by examiner

*Primary Examiner*—Timothy V. Eley
*Assistant Examiner*—David B. Thomas
(74) *Attorney, Agent, or Firm*—Wenderoth, Lind & Ponack, L.L.P.

(57) ABSTRACT

The present invention provides a substrate holding apparatus which can adjust a holding state of a substrate in accordance with a polishing state, and maintain uniformity of a polishing amount over an entire surface of the substrate, or control the polishing amount intentionally. The substrate holding apparatus comprises a holding plate having a holding surface for a substrate, a cover element for covering a backside surface of the holding plate to form a sealed back pressure space at the backside surface side, a plurality of through-holes distributed over the substantially entire holding surface for allowing the holding surface to communicate with the back pressure space, a division element removably provided for dividing the back pressure space between the holding plate and the cover element into a plurality of predetermined sealed divisional spaces in a plane, and a back pressure controller for individually controlling back pressures in the divisional spaces.

21 Claims, 10 Drawing Sheets

WAFER HOLDER AND POLISHING DEVICE

TECHNICAL FIELD

The present invention relates to a substrate holding apparatus, and more particularly to a substrate holding apparatus suitable for use in a polishing apparatus for polishing a surface of a substrate such as a semiconductor wafer to a flat mirror finish.

BACKGROUND ART

Recent rapid progress in semiconductor device integration has demanded smaller and smaller wiring patterns or interconnections and also narrower spaces between interconnections. In case of photolithography which can form interconnections that are at most 0.5 μm wide, it requires that surfaces of semiconductor wafers on which pattern images are to be focused by a stepper should be as flat as possible because the depth of focus of the optical system is relatively small. As a means for planarizing the semiconductor wafer, it is polished by a polishing apparatus.

Conventionally, this kind of polishing apparatus has a turntable with a polishing cloth constituting a polishing surface thereon, and a top ring for holding a substrate with a surface, to be polished, facing the turntable. The substrate is pressed against the turntable under a certain pressure by the top ring while the turntable and the top ring are being rotated, and the substrate is polished to a flat mirror finish while a polishing liquid is being supplied.

Figure 8:
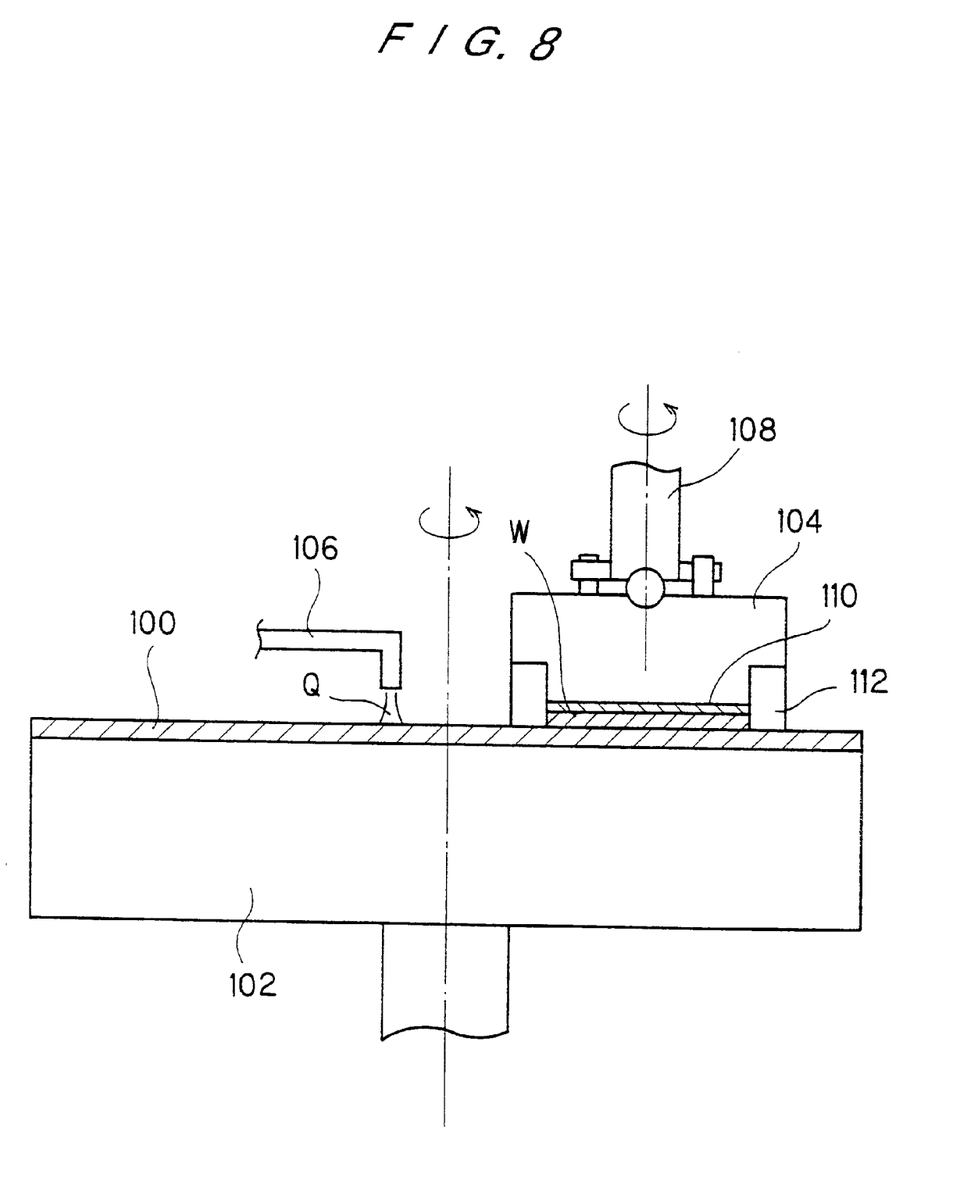
FIG. 8 is a cross-sectional view showing a structure of a conventional polishing apparatus.

FIG. 8 is a schematic view showing main parts of an example of a conventional polishing apparatus. The conventional polishing apparatus comprises a turntable 102 with a polishing cloth 100 attached to an upper surface thereof, a top ring 104 for holding a semiconductor wafer W to be polished so as to allow the semiconductor wafer W to be rotated and to be pressed, a polishing liquid supply nozzle 106 for supplying a polishing liquid Q onto the polishing cloth 100. The top ring 104 is connected to a top ring shaft 108, which is supported by a top ring head (not shown) via an air cylinder so as to be vertically movable.

The top ring 104 comprises an elastic pad 110 of polyurethane or the like on its lower surface. The semiconductor wafer W is held in contact with the elastic pad 110 by the top ring 104. The top ring 104 further comprises a cylindrical guide ring 112 on an outer circumferential edge thereof for holding the semiconductor wafer W on the lower surface of the top ring 104 during a polishing process. The guide ring 112 is fixed to the top ring 104, and has a lower end projecting downwardly from the holding surface of the top ring 104. A recess is formed inside the guide ring 112. The semiconductor substrate W to be polished is held in the recess so as not to be removed from the top ring 104 during the polishing process.

In the conventional polishing apparatus thus constructed, the semiconductor wafer W is held against the lower surface of the elastic pad 110 which is attached to the lower surface of the top ring 104. The semiconductor wafer W is then pressed against the polishing cloth 100 on the turntable 102 by the top ring 104, and the turntable 102 and the top ring 104 are rotated to move the polishing cloth 100 and the semiconductor wafer W relatively to each other, for thereby polishing the semiconductor wafer W. At this time, the polishing liquid Q is supplied onto the polishing cloth 100 from the polishing liquid supply nozzle 106. The polishing liquid Q comprises an alkaline solution containing abrasive particles of fine particles suspended therein, for example. The semiconductor wafer W is polished by a composite action comprising a chemical polishing action of the alkaline solution and a mechanical polishing action of the abrasive particles.

In order to planarize the substrate with high accuracy by the conventional polishing apparatus, it is considered to be desirable that a substrate holding surface of the top ring 104 for holding the semiconductor substrate, and the polishing surface of the polishing cloth 100, and thus the surface of the turntable 100 to which the polishing cloth 100 is attached and which affects the polishing surface have a flatness with high accuracy, respectively.

However, during a polishing process, the top ring 104 is rotated about its own axis in sliding contact with the turntable 102 which is rotated about its own axis independently of the top ring 104. The top ring 104 is deformed by a load transmitted via the air cylinder and a complex reaction force transmitted from the polishing cloth 100 to the top ring 104, and hence the flatness of the substrate holding surface deteriorates. A part of heat generated during the polishing process is removed by the supplied polishing liquid, another part of heat is transferred to the turntable 102, and the remaining heat is transferred to the top ring 104 to increase a temperature thereof and to deform the top ring 104. Therefore, in some cases, the flatness of the substrate holding surface cannot constantly be maintained. Further, in some case, it is inevitable that the polishing rate at the central portion of the substrate is different from that at the peripheral portion of the substrate, for example, because of factors hard to be controlled, such as an amount, a position, or a temperature of the polishing liquid supplied from the polishing liquid supply nozzle.

Figure 9:
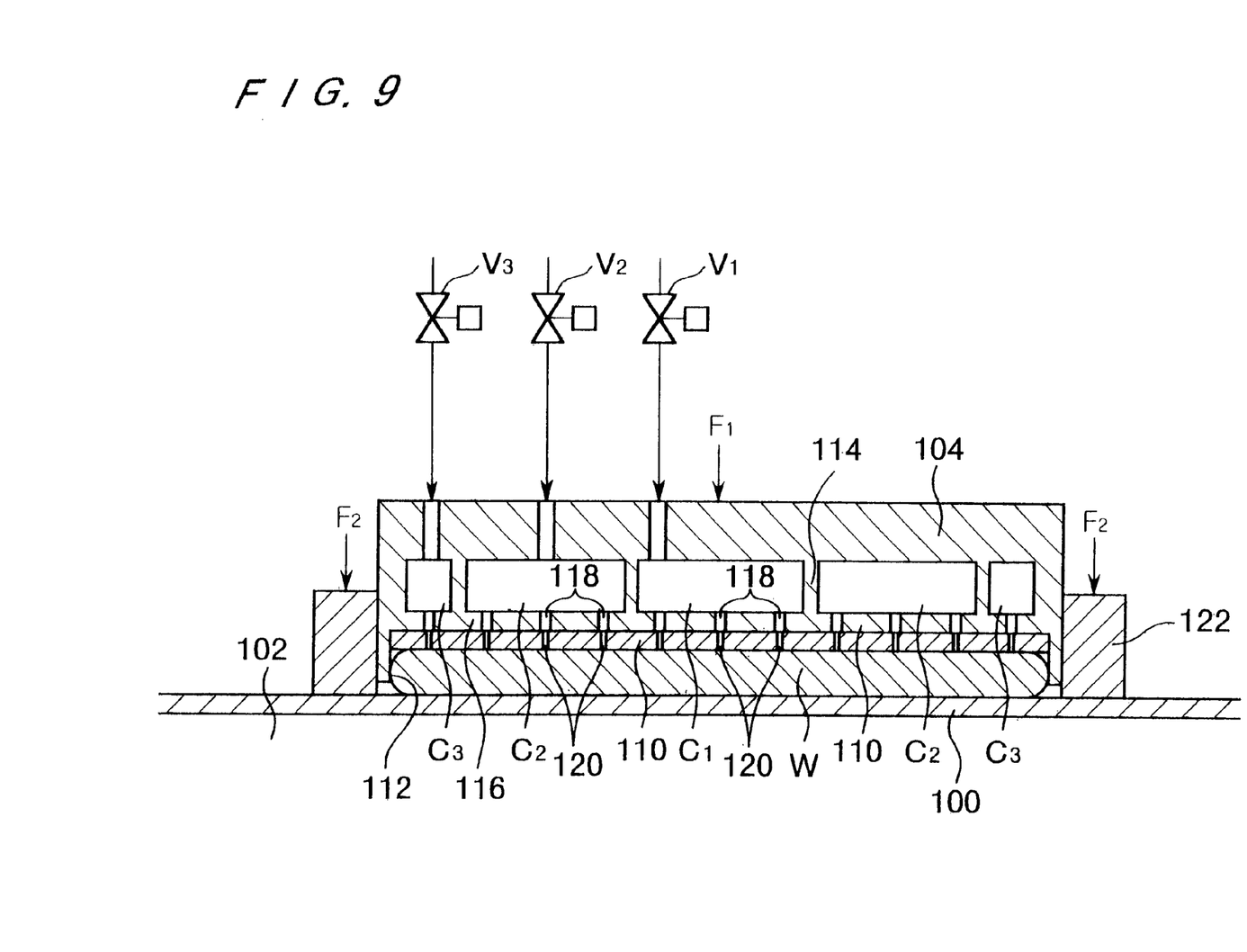
FIG. 9 is a schematic view showing another conventional polishing apparatus.

The applicant of the present invention proposed, in the Japanese laid-open Patent Publication No. 9-225821, a substrate holding apparatus as shown in FIG. 9. In this substrate holding apparatus, a plurality of pressure spaces $C_1$, $C_2$, $C_3$ defined by walls 114 are formed inside a top ring 104. In FIG. 9, the pressure spaces $C_1$, $C_2$, $C_3$ are concentrically formed. A plurality of through-holes 118 communicating with both surfaces of a holding plate 116 are formed in the holding plate 116, and through-holes 120 are similarly formed in an elastic pad 110. There is provided a back pressure control mechanism capable of supplying a pressure fluid to each of the pressure spaces $C_1$, $C_2$, $C_3$ while controlling the pressure of the pressure fluid. Thus, pressing forces on the backside surface of the substrate are individually controlled at each of areas on the substrate holding surface corresponding to each of the pressure spaces $C_1$, $C_2$, $C_3$ for thereby pressing the substrate uniformly, thus improving the planarization of the polished surface. The numeral 122 denotes a presser ring disposed around the outer periphery of the top ring 104 for pressing the polishing cloth 100 by another pressing air cylinder different from the air cylinder for the top ring.

However, in the method utilizing a pressing force of a pressurized fluid as described above, an open space is basically formed between the backside surface of the substrate and the holding surface. Therefore, it is difficult to maintain the open space under high pressure not less than a pressure applied by the top ring. As a result, a non uniform pressing force due to the deformation of the holding plate cannot be corrected, so that the degree of the planarization of the polished surface is lowered. Similarly, since each of the areas between the backside surface of the substrate and the holding surface is not hermetically sealed, air passes through a gap produced by pressurizing the backside surface of the substrate. Therefore, it is difficult to individually control each of the pressures in the areas. Further, in the apparatus thus constructed, it is difficult to change the settings of the areas in which the back pressure is controlled depending on an actual polishing state, or to properly control the pressure in accordance with the polishing state.

DISCLOSURE OF THE INVENTION

The present invention has been made in view of the above drawbacks. It is therefore an object of the present invention to provide a substrate holding apparatus which can adjust a holding state of a substrate in accordance with a polishing state, and maintain uniformity of a polishing amount over an entire surface of the substrate, or control the polishing amount intentionally.

According to the present invention as claimed in claim 1, there is provided a substrate holding apparatus for holding a substrate and pressing a surface to be polished thereof against a polishing surface on a polishing table, comprising: a holding plate having a holding surface for a substrate; a cover element for covering a backside surface of the holding plate to form a sealed back pressure space at the backside surface side; a plurality of through-holes distributed over the substantially entire holding surface for allowing the holding surface to communicate with the back pressure space; a division element removably provided for dividing the back pressure space between the holding plate and the cover element into a plurality of predetermined sealed divisional spaces in a plane; and a back pressure controller for individually controlling back pressures in the divisional spaces.

With this arrangement, a pressing force to be loaded on the substrate via an elastic pad normally becomes so uniform as to cancel an effect due to deformation of the holding plate, and hence the degree of the planarization of the polished surface can be improved. The division element preferably comprises an elastic sealing material, for example. It is easy to form the divisional spaces by disposing the division element at a predetermined position between the holding plate and the cover element, and to alter such divisional spaces. A structure for locating the division element, such as a mounting groove, may be provided in at least one of the holding plate and the cover element.

According to the present invention as claimed in claim 2, there is provided a substrate holding apparatus further comprising: a sensor for measuring a physical quantity concerned with the holding plate, and an arithmetic device for calculating an amount of deformation of the holding plate based on an output from the sensor. With this arrangement, a variation of a distribution of a pressing force applied by the holding plate in accordance with the polishing state can be estimated and adjusted to control a distribution of a polishing amount of the surface to be polished. The physical quantity may directly be measured by a strain sensor for detecting local deformation of the holding plate, or may indirectly be measured by measuring a temperature and calculating thermal deformation.

According to the present invention as claimed in claim 3, there is provided a substrate holding apparatus for holding a substrate and pressing a surface to be polished thereof against a polishing surface on a polishing table, comprising: a holding plate having a holding surface for a substrate; a cover element for covering a backside surface of the holding plate to form a sealed back pressure space at the backside surface side; a strain sensor attached to the holding plate; and a controller for adjusting a pressing force to be applied to the polishing table based on an output from the strain sensor. This arrangement can prevent the pressing force from causing excessive deformation, and create a proper polishing condition.

According to the present invention as claimed in claim 4, there is provided a substrate holding apparatus for holding a substrate and pressing a surface to be polished thereof against a polishing cloth, comprising: a holding plate having a holding surface for a substrate; a presser ring disposed around a periphery of the holding plate for pressing the polishing surface independently of the holding plate; a strain sensor attached to the holding plate; and a controller for adjusting a pressing force of the presser ring to be applied to the polishing cloth based on an output from the strain sensor. With this arrangement, a proper pressing force to cope with deterioration of the polishing cloth over time can be applied to the polishing cloth. The information on deterioration of the polishing cloth over time may be obtained by a sensor for detecting a various kind of physical quantities, and the pressing force may be controlled based on this information.

According to the present invention as claimed in claim 5, there is provided a polishing apparatus comprising a substrate holding apparatus according to any one of claims 1 to 4, and a polishing table.

According to the present invention as claimed in claim 6, there is provided a substrate holding apparatus for holding a substrate and pressing a surface to be polished thereof against a polishing surface on a polishing table, comprising: a holding plate having a holding surface for a substrate; a cover element for covering a backside surface of the holding plate to form a sealed back pressure space at the backside surface side; a plurality of through-holes distributed over the substantially entire holding surface for allowing the holding surface to communicate with the back pressure space; an O-ring and a sealing groove provided in the holding plate or the cover element for dividing the back pressure space between the holding plate and the cover element into a plurality of predetermined sealed divisional spaces; and a back pressure controller for individually controlling back pressures in the divisional spaces.

BEST MODE FOR CARRYING OUT THE INVENTION

Figure 1:
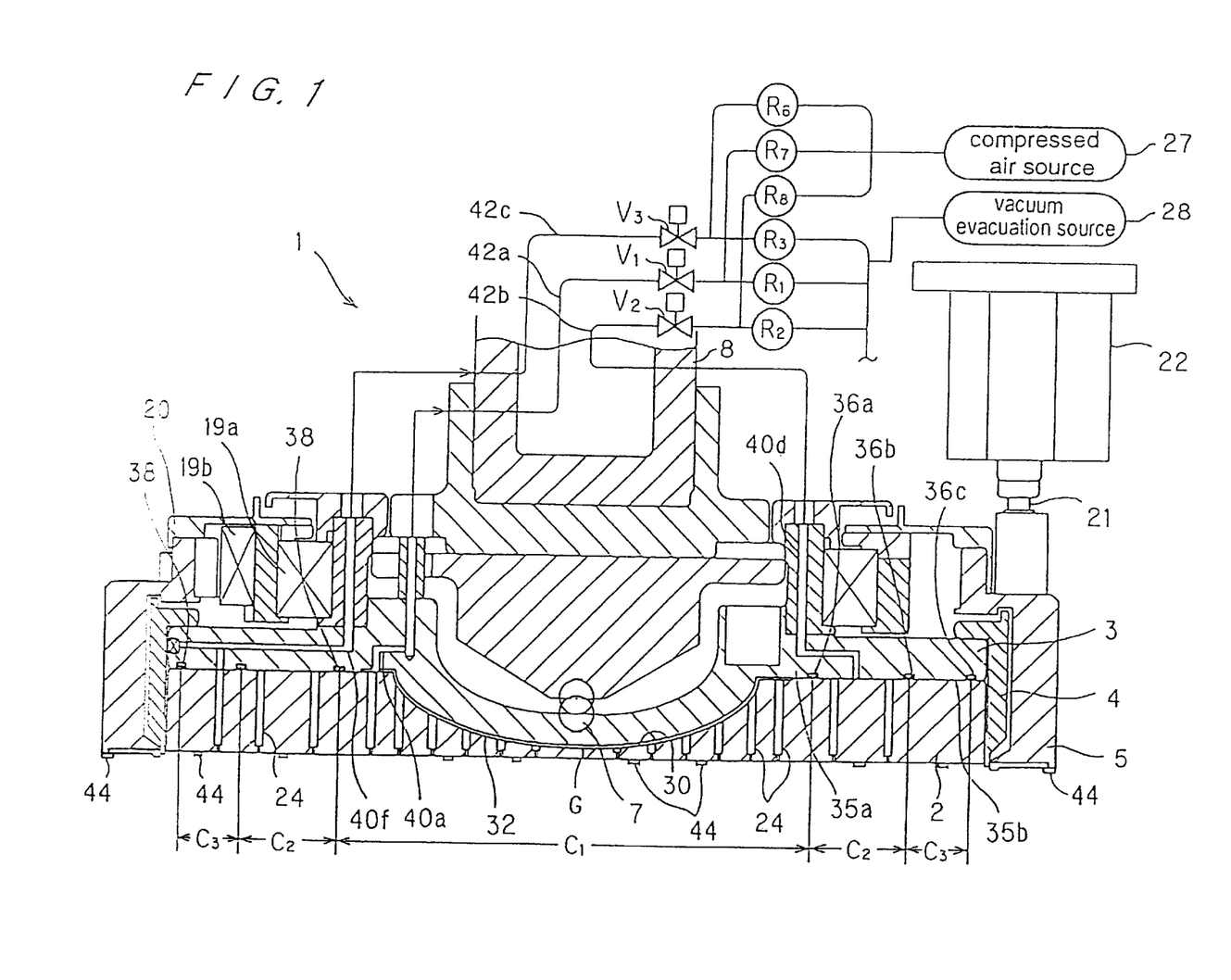
FIG. 1 is a cross-sectional view showing a substrate holding apparatus according to an embodiment of the present invention.
Figure 2:
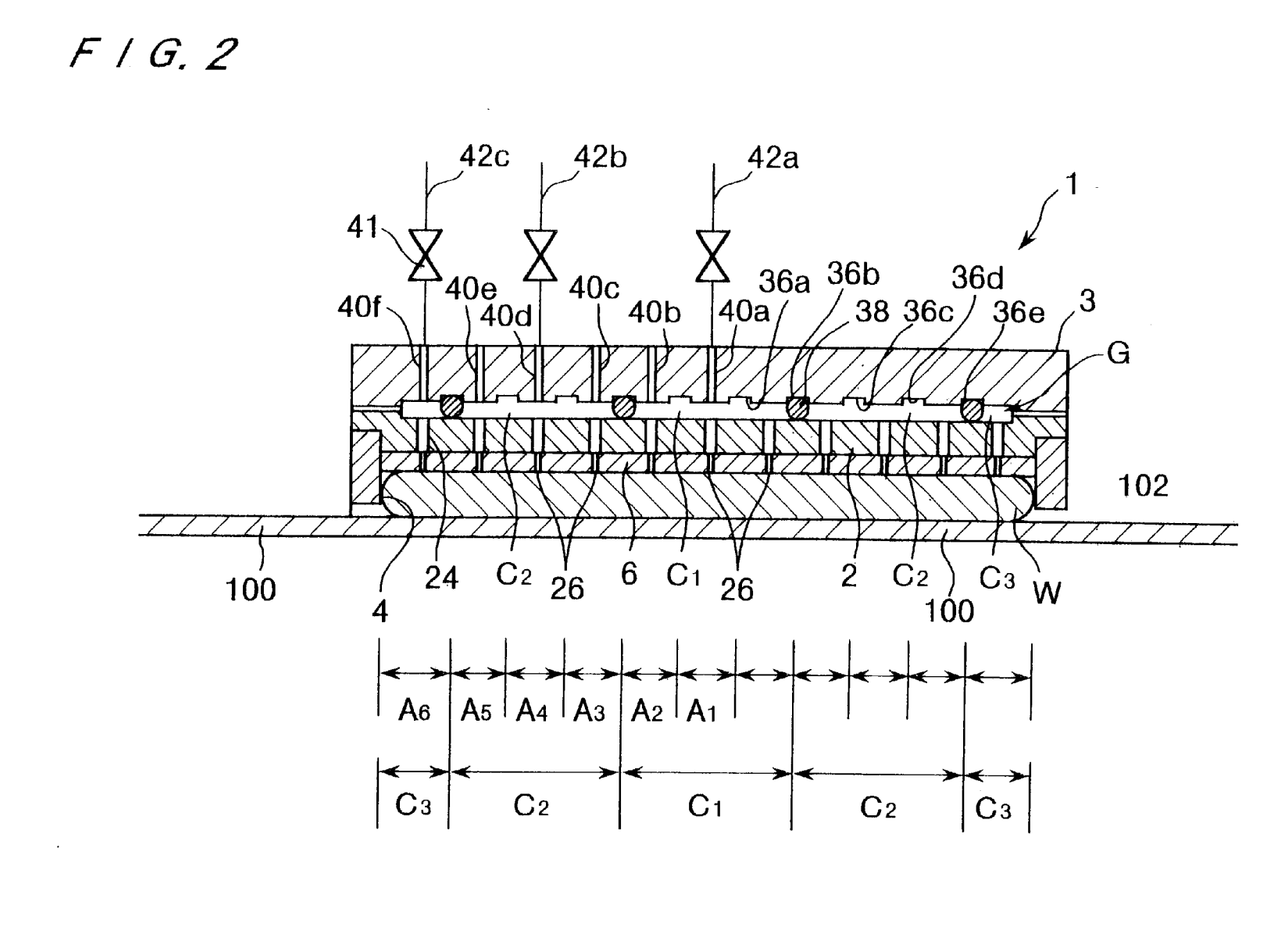
FIG. 2 is a schematic view explanatory of a back pressure control mechanism in the top ring.
Figure 2A:
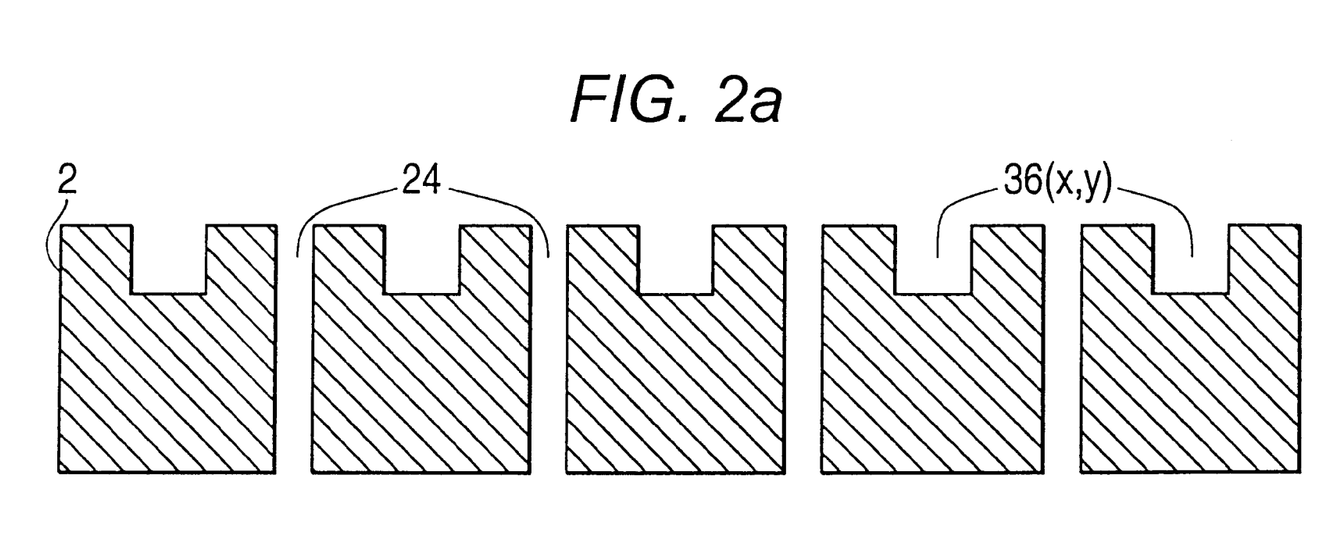
Figure 3:
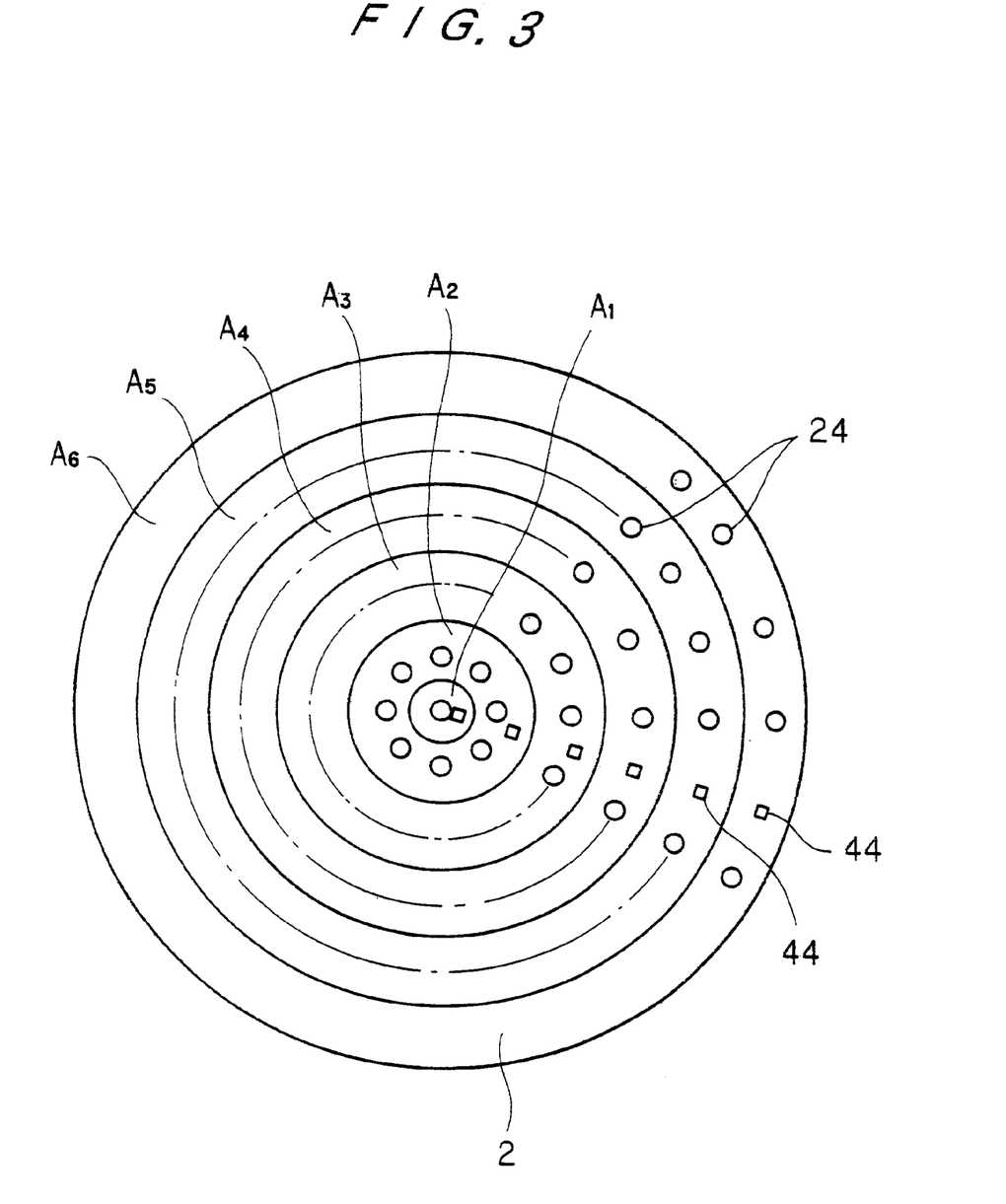
FIG. 3 is a plan view of the back pressure control mechanism shown in FIG. 2.
Figure 4:
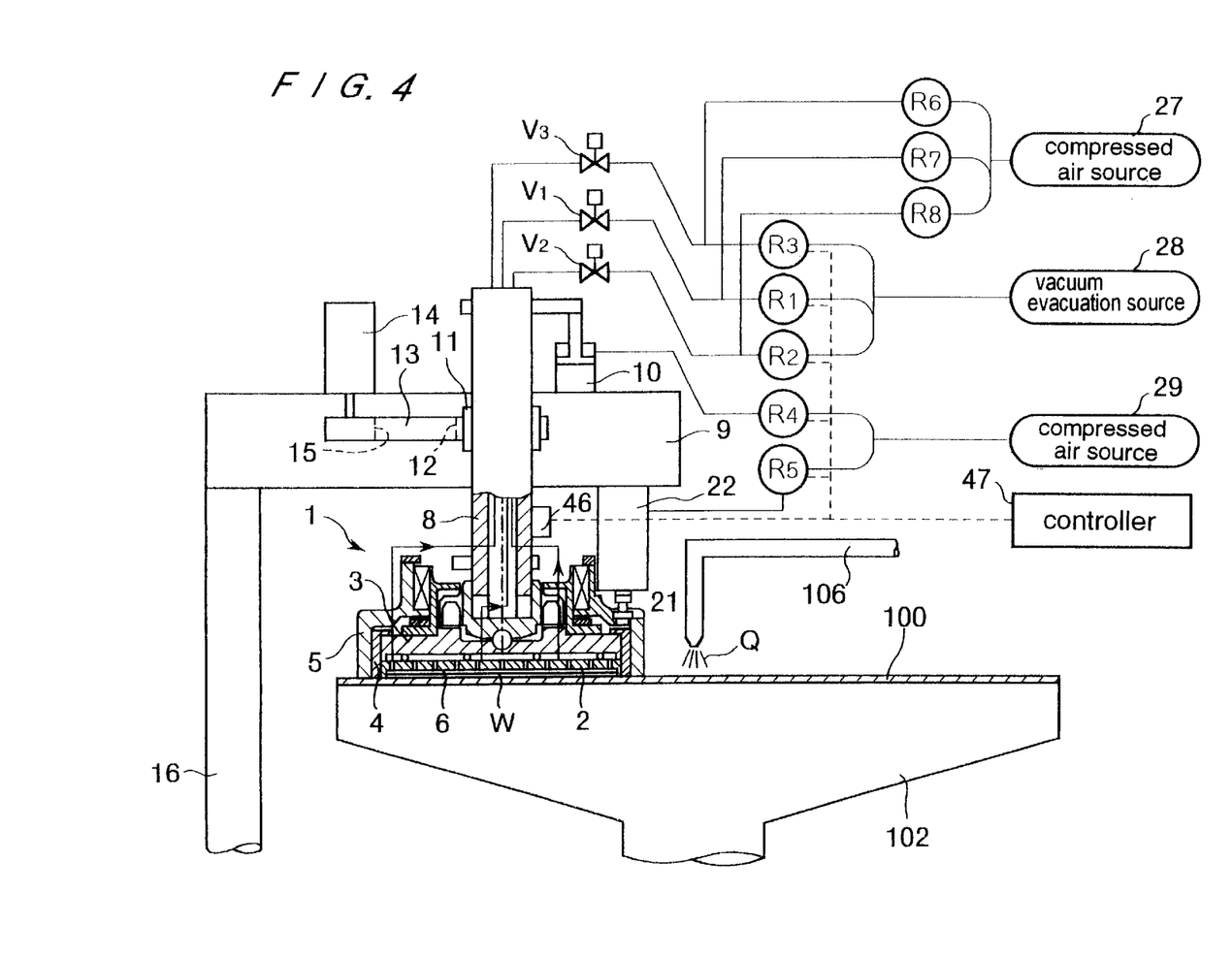
FIG. 4 is a schematic view showing a whole structure of a polishing apparatus according to an embodiment of the present invention.

An embodiment of the present invention will be described below with reference to the drawings. FIGS. 1 through 4 show an embodiment of the present invention. FIG. 1 is a schematic view showing a concrete substrate holding member (top ring) 1 in a substrate holding apparatus, FIG. 2 is a schematic view explanatory of a back pressure control mechanism in the top ring, FIG. 3 is a plan view of the back pressure control mechanism shown in FIG. 2, and FIG. 4 is a schematic view showing a whole structure of a polishing apparatus including the substrate holding apparatus (in which the top ring is schematically shown).

The top ring 1 comprises a holding plate 2, a cover plate 3 for covering a backside surface of the holding plate 2, and a guide ring 4. The top ring 1 holds a substrate w on an elastic pad 6 in a recess formed by the holding plate 2 and the guide ring 4. The cover plate 3 is connected to a top ring shaft 8 via a ball 7. The top ring shaft 8 is coupled to a top ring air cylinder 10 fixed to a top ring head 9. The top ring shaft 8 is vertically movable by the top ring air cylinder 10. The substrate W held on the lower surface of the top ring 1 is pressed against a turntable 102. In the top ring shaft 8, as described later on, there is provided a space for passing exhaust pipes connected to an evacuation source for a vacuum suction of a substrate, sensors which detect a temperature and a strain of the top ring or a pressure in a space in the top ring, and cables for actuating valves provided on the top ring 1.

The top ring shaft 8 is connected to a rotatable sleeve 11 via a key (not shown). The rotatable sleeve 11 is coupled to an output shaft of a top ring motor 14 fixed to the top ring head 9, via a timing pulley 12 mounted on a peripheral surface of the rotatable sleeve 11, a timing belt 13, and a timing pulley 15. Thus, the top ring motor 14 is driven to rotate the rotatable sleeve 11 and the top ring shaft 8 together for thereby rotating the top ring 1. The top ring head 9 is supported by a top ring head shaft 16 fixed to a frame (not shown).

A presser ring 5 is disposed around the periphery of the top ring 1. The presser ring 5 is connected to the top ring 1 via a key (not shown), and also connected to presser ring air cylinders 22 via a bearing retainer 20 for holding a radial bearing 19a and a thrust bearing 19b, and shafts 21. Thus, the presser ring 5 is adopted to be vertically movable and rotatable relative to the top ring 1 in such a state that the presser ring 5 is centered with respect to the top ring 1. The presser ring 5 is fixed to the top ring head 9 via a plurality of the presser ring air cylinders 22 (in this embodiment, three presser ring air cylinders) disposed in the circumferential direction.

The top ring air cylinder 10 and the presser ring air cylinders 22 are connected to a compressed air source 29 (see FIG. 4) respectively through regulators $R_4$ and $R_5$. The regulator $R_4$ regulates a pressure of the air supplied into the top ring air cylinder 10 to adjust a pressing force of the top ring 1 which presses the semiconductor wafer W against a polishing cloth 100. The regulator $R_5$ regulates a pressure of the air supplied into the presser ring air cylinders 22 to adjust a pressing force of the presser ring 5 which presses the polishing cloth 100.

A polishing liquid nozzle 106 is disposed above the turntable 102 to supply a polishing liquid onto the polishing cloth 100 on the turntable 102.

A recess 30 with an elliptic cross-section is formed at the central portion in the upper surface of the holding plate 2. A bulge 32 with a shape corresponding to the recess 30 protrudes downwardly from the central portion on the lower surface of the cover plate 3. On the lower surface of the cover plate 3 (the opposite surface to the holding plate 2), two annular protrusions 35a, 35b are formed respectively at the outside of the bulge 32 and at the outer peripheral portion of the cover plate 3, and hence a gap G is formed between the holding plate 2 and the cover plate 3. A plurality of through-holes 24 are formed so as to be approximately equally distributed on the entire surface of the holding plate 2. Through-holes 26 are formed in the elastic pad 6 at positions corresponding to the through-holes 24. Further, a plurality of annular sealing grooves 36a, 36b, . . . , 36e (five sealing grooves in the drawings) are concentrically formed in the lower surface of the cover plate 3 (see FIG. 2) to thus divide the gap G into a plurality of areas $A_1, A_2, \ldots, A_6$.

Mounting ring-shaped sealing materials 38 into the sealing grooves 36a, 36b, 36c, . . . , allows the gap G to be divided into a plurality of concentric spaces $C_1, C_2, C_3, \ldots$, surrounded by the sealing materials 38. For example, the sealing materials 38 are made of fluororubber (Viton). The mode of such a division may be changed by altering the mode of mounting the sealing materials 38. In the illustrated embodiment, the sealing members 38 are mounted into only the second and fifth sealing grooves from the inner side, so that the gap G is divided into three spaces, i.e., $C_1=A_1+A_2$, $C_2=A_3+A_4+A_5$, $C_3=A_6$.

A plurality of communication holes 40a, 40b, 40c, . . . , 40f which are open to the spaces $A_1, A_2, \ldots, A_5$, defined between each of the sealing grooves 36a, 36b, 36c, . . . , extend through the cover plate 3. Ports of the communication holes 40a, 40b, 40c, . . . , 40f on the upper surface of the cover plate are connected to a vacuum evacuation source 28 via switching valves 41, discharge paths 42a, 42b, 42c in the top ring shaft 8, and regulators $R_1$ to $R_3$, and connected to the compressed air source 27 via the switching valves 41, the discharge paths 42a, 42b, 42c, and regulators $R_6$ to $R_8$.

In this embodiment, temperature sensors for measuring a temperature of the holding plate 2 and strain sensors for measuring deformation of the holding plate 2 (these sensors are represented by the numeral 44) are disposed so as to be adequately distributed over an area corresponding to the entire surface of the substrate. Detection outputs from the sensors 44 are inputted via a multiplex transmission unit 46 into a controller 47, which calculates the detection outputs and estimates the deformation state of the entire holding plate 2. The calculation of the data can be performed by known programs, and the details of the calculation will not be described herein. The deformation state can be estimated based on either data of the strain sensors or data of the temperature distribution. In this embodiment, both of data are used in order to get higher accuracy.

In this embodiment, strain sensors are also provided at predetermined positions on the presser ring 5. Outputs from these sensors are inputted into the controller 47, so that the deformation state of the presser ring 5 is determined based on the outputs. If the amount of the deformation exceeds a predetermined limitation, then a pressure applied to the presser ring 5 by means of the presser ring air cylinders 22 is controlled via the regulator $R_5$. This control is required in order to cope with deterioration of the polishing cloth 100 with time.

The operation of the polishing apparatus thus constructed will be described below with laying stress on the operation of the controller. The turntable 102 is rotated while a polishing liquid Q is being supplied thereon from the polishing liquid supply nozzle 106, and then the substrate W held by the top ring 1 is pressed against the polishing cloth 100 on the turntable 102 under a predetermined pressure by the top ring air cylinder 10, for thereby polishing the substrate W. Data on strains and temperatures of the lower surface (holding surface) of the holding plate 2 are outputted from the sensors 44 and then inputted into the controller 47. The controller 47 estimates the amount of the deformation of the holding plate 2 based on the data.

The controller 47 controls a pressure (back pressure) between the substrate W and the holding plate 2 so as to cancel a non uniform pressing force to be loaded on the substrate W by the holding plate 2 in accordance with the amount of the deformation which is estimated based on the data. Specifically, when the lower surface of the holding plate 2 is not flat, the elastic pad 6 is compressed by the portion of the holding plate protruding toward the substrate, and hence the pressing force applied to the substrate W is locally increased. Therefore, a convex area and a concave area of the holding plate 2 are deduced based on the estimated deformation state, and then the regulators $R_1$ to $R_3$ and $R_6$ to $R_8$ are controlled so that the back pressure of the convex area is smaller than that of the concave area, for thereby adjusting the back pressure applied to the backside surface of the substrate W. Thus, the pressing force to be loaded on the substrate W via the elastic pad 6 becomes so uniform as to cancel the effect due to the deformation of the holding plate 2, and hence the degree of the planarization of the polished surface can be improved.

In this embodiment, if the amount of the deformation of the holding plate 2 is determined to be excessively large, then the pressing force by the top ring air cylinder 10 is controlled via the regulator $R_4$ in order to reduce the amount of the deformation of the holding plate 2.

Since the top ring 1 is rotated about its own axis, the deformation of the substrate holding surface is considered to be rotationally symmetric, if averaged over a certain period. Therefore, it is considered that the back pressure can sufficiently be controlled by an axially symmetric control with respect to each of the concentric spaces. However, if it is determined that it is desirable to change the division of the spaces for the back pressure control on the basis of the deformation estimated based on the processing of the temperature sensors and/or the strain sensors, then the arrangement of the sealing materials 38 may be changed with separating the cover plate 3 and the holding plate 2 and joining them together. Alternatively, the top ring 1 may be exchanged depending on the situations for another top ring in which the arrangement of the sealing materials 38 is changed. In this case, it is, of course, necessary to change connections between the communication holes 40a, 40b, 40c, . . . , 40f and the discharge paths 42a, 42b, 42c.

In this embodiment, although the sealing grooves 36a to 36e are formed in the cover plate 3 constituting the top ring 1, they may be formed in the holding plate 2, or in both of the cover plate 3 and the holding plate 2. The present invention is not intended to be limited to the embodiment described above, for example, the discharge paths for the back pressure control, the number of the regulators, the number of the sealing grooves, and the like. Further, the back pressure may be controlled with distinguishing between a positive pressure and a negative pressure at each of the areas. For example, the central portion and the peripheral portion are evacuated, and only the intermediate portion is pressurized, whereby excess or shortage of polishing can be adjusted more effectively. A fluid to be supplied may be not only gas, but also liquid such as pure water.

In the embodiment described above, although the control is an axially symmetric control utilizing the concentrically divided spaces, the sealing grooves and the sealing materials may be disposed in the radial direction to divide back pressure spaces in a circumferential direction. When the deformation is not axially symmetric, this arrangement provides a higher accurate control. As described above, various changes and modifications may be made without departing from the scope of the present invention.

Figure 5:
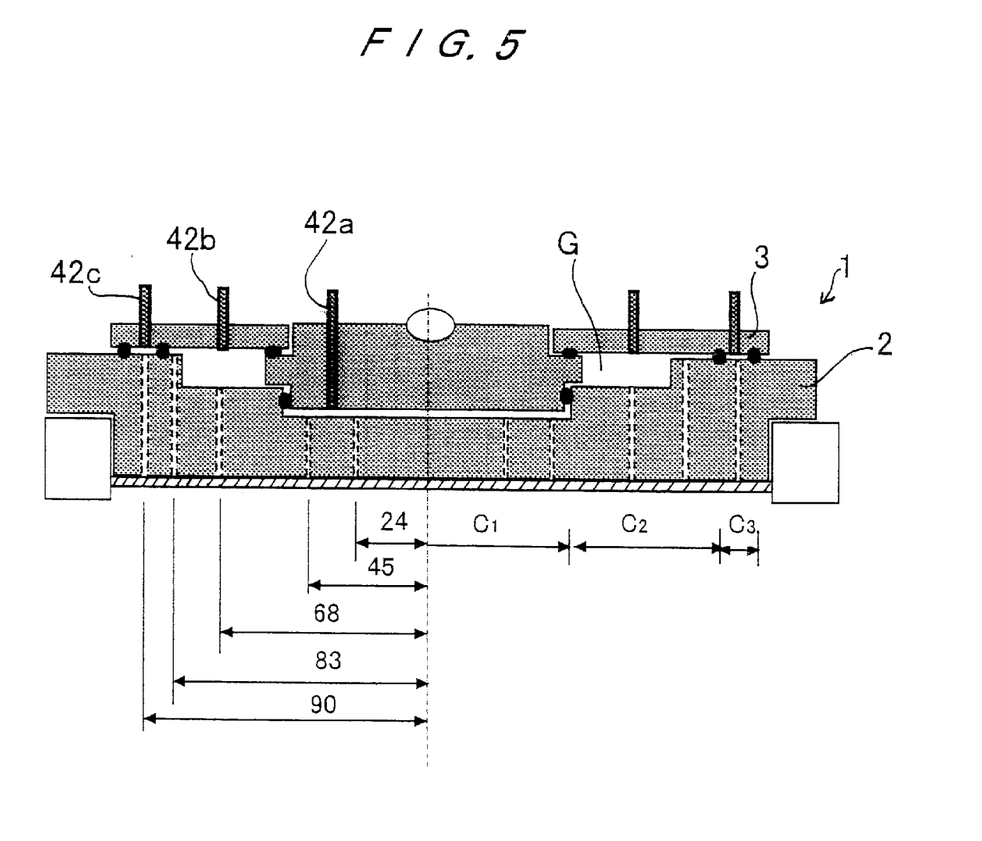
FIG. 5 is a cross-sectional view schematically showing a cross-sectional structure of a top ring used in an actual polishing.

FIGS. 5 through 7 show results of experiments in actual polishing processes. FIG. 5 is a cross-sectional view schematically showing a cross-sectional structure of a top ring used in the experiments. As shown in FIG. 5, a gap G between a holding plate 2 and a cover plate 3 is divided into three concentric pressure spaces $C_1$, $C_2$, $C_3$ from the central side toward the peripheral side. Pressures in the pressure spaces $C_1$, $C_2$, $C_3$ are individually controlled via discharge paths 42a, 42b, 42c. In FIG. 5, the numerals denote actual lengths from the center by millimeter.

Figure 6A:
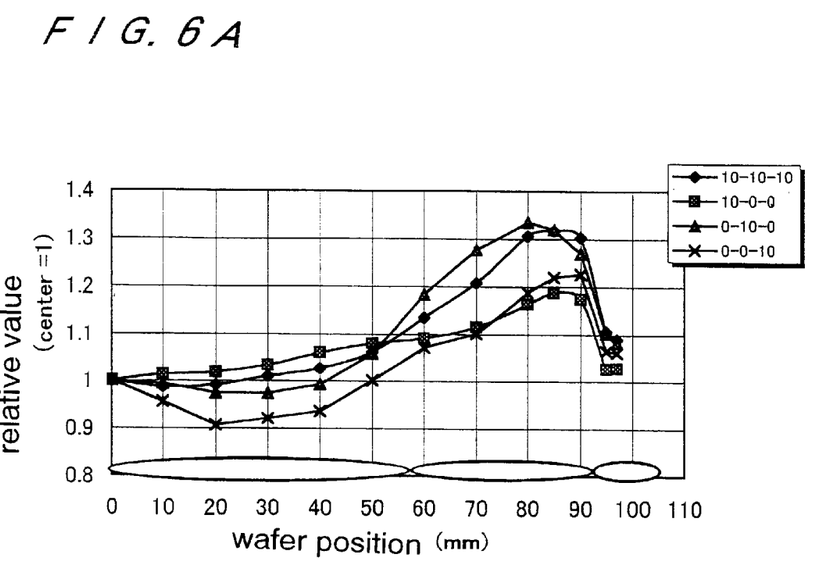
FIG. 6 are graphs showing examples of polishing shapes with use of the top ring shown in FIG. 5.

First, the top ring 1 shown in FIG. 5 was used, the load of the top ring was 500 gf/cm$^2$ (about 50 kPa), and the pressure sets of the pressure spaces $C_1$–$C_2$–$C_3$ were 10-10-10, 10-0-0, 0-10-0, and 0-0-10 (the unit is kPa, and pressure 0 represents that pressure is not applied, hereinafter the same). The results in these conditions are shown in FIG. 6A. Each of the numerals denotes a relative value at each of portions in a wafer on the basis of a wafer center of 1 (each of points is an average of 16 points disposed concentrically).

Figure 6B:
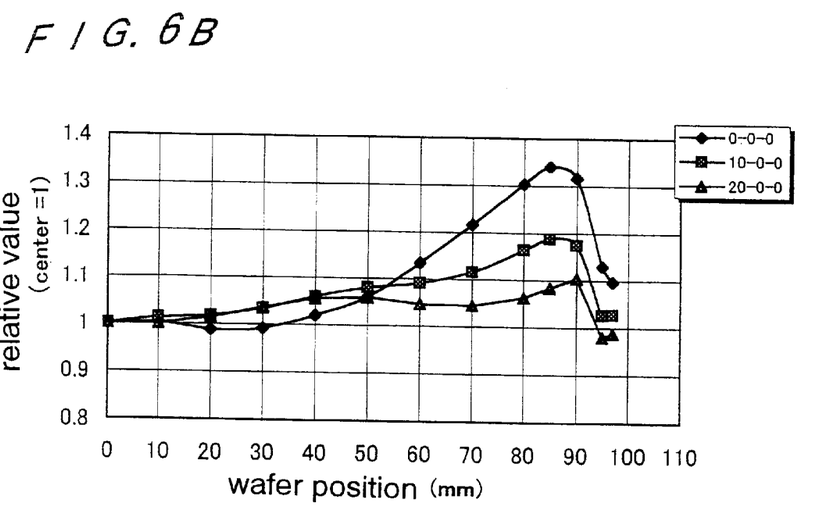

Results of experiments in which the pressure sets of the pressure spaces $C_1$–$C_2$–$C_3$ were 0-0-0, 10-0-0, and 20-0-0, are shown in FIG. 6B.

It is apparent that the pressurized position varies a polishing shape of a wafer surface, and the uniformity on the surface can be improved when the central portion is pressurized. It is considered that since the entire load is constant, pressurizing the central portion can relatively reduce a load on the peripheral portion. Thus, the pressure control in local areas can easily control the polishing shape. In one of the experiments, although the pressure set of the pressure spaces was 10-0-0, it is considered to get the same results when the pressure set of the pressure spaces is 20-10-10 or the like. That is, a pressure difference is important and can vary the polishing shape.

Figure 7A:
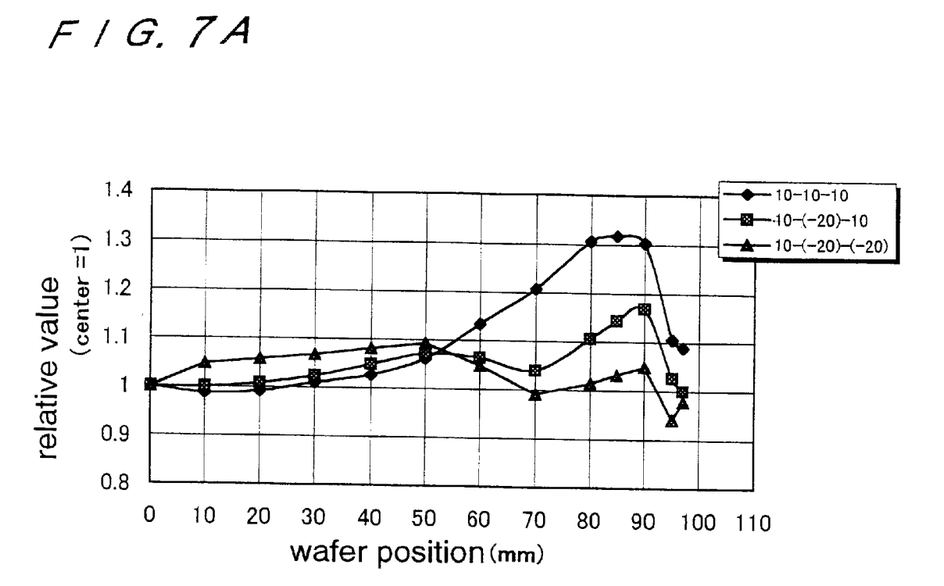
FIG. 7 are graphs showing other examples of polishing shapes with use of the top ring shown in FIG. 5.

Further, results of experiments in which the pressure sets of the pressure spaces $C_1$–$C_2$–$C_3$ were 10-10-10, 10-(–20)-10, and 10-(–20)-(–20), are shown in FIG. 7A. The minus sign represents a negative pressure (suction).

Figure 7B:
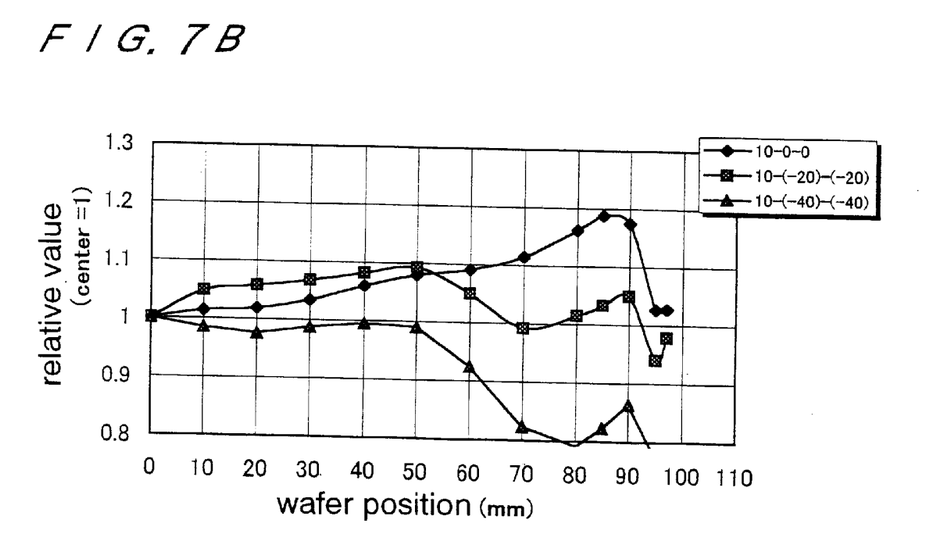

Furthermore, results of experiments in which the pressure sets of the pressure spaces $C_1$–$C_2$–$C_3$ were 10-0-0, 10-(–20)-(–20), and 10-(–40)-(–40), are shown in FIG. 7B.

It is apparent that when a pressure is locally reduced by suction, a polishing amount at the suction position can be reduced. Since the wafer, the elastic pad, and the top ring adhere to each other, a polishing liquid fails to flow upwardly through the through-holes.

In the case of suction, the mode of control is determined by the material of the elastic pad. For example, in the case of a soft elastic pad (for example, NF200 (Rodel Nitta Inc.)), since the elastic pad is liable to be deformed, it can be deformed at a negative pressure of about 20 kPa to have the effect described above. On the other hand, in the case of a hard pad (for example, silicon rubber, polyurethane rubber, or PET film), since the deformation is small, the performance of polishing is improved only when a large negative pressure is applied. Therefore, it is required to apply a negative pressure of about 800 gf/cm$^2$, for example.

As described above, a pressure is divisionally applied to a backside surface of a wafer, and a positive pressure (or suction) is locally applied, whereby a polishing shape can be controlled.

As described above, according to the present invention, since a backside surface of a wafer is properly divided to control a pressure thereon, a non uniform distribution of a pressing force can be corrected to thus polish an entire surface of a substrate to a flat mirror finish with an improved distribution of a polishing amount. Tens of thousands of electric device elements such as transistors are formed on the surface of the semiconductor substrate with use of high-density miniaturization technology in which height differences on the surface are not more than 1 µm, and height differences between elements are not more than 1 µm. The fine height difference, space, and aspect ratio (depth/width) can be improved by planarization technology. When technology to uniform a pressure on the entire surface of the wafer with high accuracy according to the present invention is applied to a semiconductor fabrication process or the like, high quality polishing can be achieved. Since the peripheral portion of the semiconductor wafer can also be used for products, yield factor of the semiconductor wafer can be improved. Further, according to the present invention, the polishing amount can be intentionally controlled so as to be a predetermined distribution in accordance with the type of a substrate such as a semiconductor wafer.

Industrial Applicability

The present invention relates to polishing apparatus for polishing a surface of a substrate such as a semiconductor wafer to a flat mirror finish, and to a substrate holding apparatus suitable for use in the polishing apparatus. The present invention is applicable to a semiconductor fabrication process or the like for a high quality polishing over an entire surface of a wafer.

What is claimed is:

1. A substrate holding apparatus for holding a substrate and pressing a surface of the substrate to be polished against a polishing surface on a polishing table, comprising:
    a holding plate having a holding surface for a substrate;
    a cover element for covering a backside surface of said holding plate to form a back pressure space between said cover element and the backside surface of said holding plate;
    a plurality of through-holes distributed over substantially the entire holding surface for allowing said holding surface to communicate with the back pressure space;
    sealing material for dividing the back pressure space into a plurality of co-planar predetermined sealed divisional spaces;
    a plurality of sealing grooves formed in said cover element or the backside surface of said holding plate for removably receiving said sealing material; and
    a back pressure controller for individually controlling back pressures in the sealed divisional spaces.

2. The substrate holding apparatus according to claim 1, further comprising:
    at least one sensor for measuring a physical quantity associated with the entire holding surface; and
    an arithmetic device for calculating an amount of deformation of said holding plate based on an output from said at least one sensor.

3. A substrate holding apparatus for holding a substrate and pressing a surface of the substrate to be polished against a polishing surface on a polishing table, comprising:
    a holding plate having a holding surface for a substrate;
    a cover element for covering a backside surface of said holding plate to form a sealed back pressure space between said cover element and the backside surface of said holding plate;
    at least one of a strain sensor and a temperature sensor attached to said holding plate; and
    a controller for adjusting a pressing force to be applied to the polishing surface based on an output from said at least one of said strain sensor and temperature sensor.

4. The substrate holding apparatus according to claim 3, wherein said at least one of a strain sensor and a temperature sensor comprises a strain sensor and a temperature sensor.

5. A substrate holding apparatus for holding a substrate and pressing a surface of the substrate to be polished against a polishing surface on a polishing table, comprising:
    a holding plate having a holding surface for a substrate;
    a presser ring disposed around a periphery of said holding plate for pressing the polishing surface independently of said holding plate;
    a strain sensor attached to said presser ring; and
    a controller for adjusting a pressing force to be applied to the polishing surface by said presser ring based on an output from said strain sensor.

6. A substrate holding apparatus for holding a substrate and pressing a surface of the substrate to be polished against a polishing surface on a polishing table, comprising:
    a holding surface for holding a substrate; and
    pressure areas provided at said holding surface, separated from one another by sealing material, for pressing a backside surface of the substrate with respective pressures;
    wherein said pressure areas are capable of being altered and respectively controlled by changing mounting positions of said sealing material.

7. The substrate holding apparatus according to claim 6, wherein said sealing material comprises O-rings.

8. The substrate holding apparatus according to claim 6, wherein said pressure areas are concentric relative to one another.

9. The substrate holding apparatus according to claim 6, wherein said pressure areas are for pressing the backside surface of the substrate with a fluid pressure.

10. The substrate holding apparatus according to claim 6, further comprising a presser ring disposed around a periphery of said holding surface for pressing the polishing surface independently of said holding surface.

11. The substrate holding apparatus according to claim 10, wherein said presser ring is constructed and arranged to be pressed by a fluid pressure.

12. A polishing apparatus, comprising:
    a polishing table; and
    a substrate holding device for holding a substrate and pressing a surface of the substrate to be polished against a polishing surface on said polishing table, said substrate holding device, including:
        (i) a holding plate having a holding surface for a substrate;
        (ii) a cover element for covering a backside surface of said holding plate to form a back pressure space between said cover element and the backside surface of said holding plate;
        (iii) a plurality of through-holes distributed over substantially the entire holding surface for allowing said holding surface to communicate with the back pressure space;
        (iv) sealing material for dividing the back pressure space into a plurality of co-planar predetermined sealed divisional spaces;

(v) a plurality of sealing grooves formed in said cover element or the backside surface of said holding plate for removably receiving said sealing material; and (iv) a back pressure controller for individually controlling back pressures in the sealed divisional spaces.

13. The polishing apparatus according to claim 12, wherein said substrate holding device further includes:

at least one sensor for measuring a physical quantity associated with the entire holding surface of said holding plate; and an arithmetic device for calculating an amount of deformation of said holding plate based on an output from said at least one sensor.

14. A polishing method comprising:

holding a substrate by a holding surface;

pressing a surface of the substrate to be polished against a polishing surface on a polishing table by controlling respective pressures of a plurality of pressure areas, provided at said holding surface and separated by sealing material, such that the respective pressures are applied to a backside surface of said substrate;

wherein said pressure areas are altered, as necessary, by changing mounting positions of said sealing material.

15. The polishing method according to claim 14, wherein controlling respective pressures of a plurality of pressure areas that are provided at said holding surface and separated by sealing material, comprises controlling respective pressures of a plurality of pressure areas that are provided at said holding surface and separated by at least one O-ring.

16. The polishing method according to claim 14, wherein controlling respective pressures of a plurality of pressure areas comprises controlling respective pressures of concentric pressure areas.

17. The polishing method according to claim 14, wherein controlling respective pressures of a plurality of pressure areas such that respective pressures are applied to a backside surface of said substrate comprises controlling the respective pressures of the plurality of pressure areas such that respective fluid pressures are applied to the backside surface of said substrate.

18. The polishing method according to claim 14, further comprising pressing said polishing surface with a presser ring, disposed around a periphery of said holding surface, independently of pressing said polishing surface via said holding surface.

19. The polishing method according to claim 18, wherein pressing said polishing surface with a presser ring comprises pressing said presser ring with a fluid pressure.

20. A polishing apparatus comprising:

a polishing table; and a substrate holding device for holding a substrate and pressing a surface of the substrate to be polished against a polishing surface on said polishing table, said substrate holding device including:

(i) a holding plate having a holding surface for a substrate;

(ii) a cover element for covering a backside surface of said holding plate to form a sealed back pressure space between said cover element and the backside surface of said holding plate;

(iii) at least one of a strain sensor and a temperature sensor attached to said holding plate; and (iv) a controller for adjusting a pressing force to be applied to the polishing surface based on an output from said at least one of said strain sensor and temperature sensor.

21. The substrate holding apparatus according to claim 20, wherein said at least one of a strain sensor and a temperature sensor comprises a strain sensor and a temperature sensor.

* * * * *

UNITED STATES PATENT AND TRADEMARK OFFICE
CERTIFICATE OF CORRECTION

PATENT NO.     : 6,435,956 B1
DATED          : August 20, 2002
INVENTOR(S)    : Shin Ohwada et al.

It is certified that error appears in the above-identified patent and that said Letters Patent is hereby corrected as shown below:

<u>Title page, Item [54] and Column 1, line 1,</u>
Title, change "WAFER HOLDER AND POLISHING DEVICE" to
-- SUBSTRATE HOLDING APPARATUS AND POLISHING APPARATUS --.

Signed and Sealed this

Seventeenth Day of December, 2002

JAMES E. ROGAN
*Director of the United States Patent and Trademark Office*